(12) United States Patent
Saito et al.

(10) Patent No.: US 12,144,111 B2
(45) Date of Patent: Nov. 12, 2024

(54) PRINTED CIRCUIT BOARD AND METHOD OF PRODUCING PRINTED CIRCUIT BOARD

(71) Applicant: DENSO CORPORATION, Kariya (JP)

(72) Inventors: Hirokazu Saito, Kariya (JP); Soji Masui, Kariya (JP); Kazuma Yamaguchi, Kariya (JP)

(73) Assignee: DENSO CORPORATION, Kariya (JP)

(*) Notice: Subject to any disclaimer, the term of this patent is extended or adjusted under 35 U.S.C. 154(b) by 0 days.

(21) Appl. No.: 17/647,574

(22) Filed: Jan. 10, 2022

(65) Prior Publication Data

US 2022/0225502 A1 Jul. 14, 2022

(30) Foreign Application Priority Data

Jan. 12, 2021 (JP) .................. 2021-002829

(51) Int. Cl.
| | |
|---|---|
| *H05K 1/11* | (2006.01) |
| *H01L 23/00* | (2006.01) |
| *H05K 1/18* | (2006.01) |
| *H05K 3/24* | (2006.01) |
| *H05K 3/46* | (2006.01) |

(52) U.S. Cl.
CPC .............. *H05K 1/111* (2013.01); *H01L 24/48* (2013.01); *H05K 1/118* (2013.01); *H05K 1/189* (2013.01); *H05K 3/244* (2013.01); *H05K 3/4673* (2013.01); *H01L 2224/48158* (2013.01); *H01L 2224/48464* (2013.01); *H05K 2201/09445* (2013.01); *H05K 2201/10287* (2013.01); *H05K 2203/049* (2013.01)

(58) Field of Classification Search
CPC .......... H05K 1/11; H05K 1/111; H05K 1/118; H05K 1/189; H05K 3/244; H01L 24/48
USPC ......................................... 174/250
See application file for complete search history.

(56) References Cited

U.S. PATENT DOCUMENTS

| | | | |
|---|---|---|---|
| 6,291,775 B1 | 9/2001 | Saitoh | |
| 2005/0285973 A1 | 12/2005 | Singh et al. | |
| 2006/0017151 A1* | 1/2006 | Yoon | H01L 21/4853 257/737 |
| 2010/0226110 A1 | 9/2010 | Kouya | |
| 2012/0061833 A1* | 3/2012 | Jeong | H01L 24/32 257/E23.021 |
| 2016/0178839 A1 | 6/2016 | Tsujita et al. | |

FOREIGN PATENT DOCUMENTS

| | | |
|---|---|---|
| JP | 2001044234 A | 2/2001 |
| JP | 2001135675 A | 5/2001 |
| JP | 5877595 B2 | 3/2016 |
| JP | 2019212713 A | 12/2019 |

* cited by examiner

*Primary Examiner* — Tremesha S Willis
(74) *Attorney, Agent, or Firm* — MASCHOFF BRENNAN

(57) ABSTRACT

A printed circuit board capable of reducing or suppressing connection failure includes a base film made of insulating material, an electric conductor pattern formed on a front surface of the base film, and an insulating cover film covering the electric conductor pattern. The printed circuit board also includes a circuit portion with a circuit formed by the electric conductor pattern, and a pad portion with a bonding pad composed of the electric conductor pattern exposed from the insulating cover film. The pad portion has higher rigidity than the circuit portion.

14 Claims, 3 Drawing Sheets

PRINTED CIRCUIT BOARD AND METHOD OF PRODUCING PRINTED CIRCUIT BOARD

CROSS-REFERENCE TO RELATED APPLICATION

This patent application is based on and claims priority to Japanese Patent Application No. 2021-002829, filed on Jan. 12, 2021 in the Japan Patent office, the entire disclosure of which is hereby incorporated by reference herein.

BACKGROUND

Technical Field

The present disclosure relates to a printed circuit board and a method of producing the printed circuit board.

Related Art

A Flexible Printed Circuit (herein after simply referred to as an FPC) substrate is generally composed of a base film made of resin and a copper foil pattern or the like formed on the base film. Accordingly, rigidity of the FPC substrate is relatively low. Hence, in a known wire bonding system wires are bonded to the FPC substrate while a reinforcing material is affixed to a back surface of the FPC substrate thereby supporting the FPC substrate.

However, even if the reinforcing material is affixed to the back surface of the FPC substrate, rigidity of the FPC substrate itself yet remains relatively low. In particular, when a pad portion with a bonding pad is mainly made of resin or the like having a low elastic modulus, the bonding pad sinks inward during wire bonding. As a result, a load cannot be applied by a capillary to the bonding pad resulting in connection failure.

The present disclosure is made to address and resolve the above-described problem and an object thereof is to provide a novel printed circuit board capable of suppressing or reducing connection failure.

SUMMARY

Accordingly, one aspect of the present disclosure provides a novel printed circuit board having at least a circuit portion and a pad portion separately located from the circuit portion. The printed circuit board comprises a base film extended across the circuit portion and the pad portion. The base film is made of an insulating material. The printed circuit board further comprises a first electric conductor pattern formed on a front surface of the base film. The first electric conductor pattern forms a circuit in the circuit portion and a bonding pad in the pad portion, respectively. The bonding pad is connected to an IC chip via a bonding wire by using a capillary. The printed circuit board further comprises an insulating cover film entirely covering the first electric conductor pattern except for the bonding pad in the pad portion. The pad portion has higher rigidity than the circuit portion.

Hence, according to one aspect of the present disclosure, by increasing a degree of rigidity of the pad portion to be higher than that of rigidity of the circuit portion, sinking of the bonding pad during wire bonding can be reduced or suppressed while reducing or suppressing connection failure and maintaining low rigidity of the circuit portion at the same time.

Another aspect of the present disclosure provides a novel printed circuit board having at least a circuit portion and a pad portion separately located from the circuit portion. The printed circuit board comprises a base film extended across the circuit portion and the pad portion. The base film is made of an insulating material. The printed circuit board further comprises a first electric conductor pattern formed on a front surface of the base film and a first insulating cover film covering the first electric conductor pattern.

The printed circuit board further comprises: a second electric conductor pattern formed on a back surface of the base film; a second insulating cover film covering the second electric conductor pattern; and at least one circuit formed by one of the first electric conductor pattern and the second electric conductor pattern in the circuit portion.

The printed circuit board further comprises a bonding pad composed of a part of the first electric conductor pattern exposed from the first cover film in the pad portion. The bonding pad is connected to an IC chip via a bonding wire by using a capillary. The pad portion has higher rigidity than the circuit portion.

Hence, according to another aspect of the present disclosure, by increasing the degree of rigidity of the pad portion higher than that of rigidity of the circuit portion, sinking of the bonding pad during wire bonding can be reduced while maintaining low rigidity of the circuit portion and suppressing or reducing connection failure at the same time.

Yet another aspect of the present disclosure provides a novel printed circuit board that comprises: a base film made of insulating material; a first electric conductor pattern formed on a front surface of the base film; and a first insulating cover film covering the first electric conductor pattern.

The printed circuit board further comprises: a second electric conductor pattern formed on a back surface of the base film; a second insulating cover film covering the second electric conductor pattern; and at least one circuit formed by one of the first electric conductor pattern and the second electric conductor pattern.

The printed circuit board further comprises a bonding pad composed of a part of the first electric conductor pattern exposed from the first cover film. The bonding pad s connected to an IC chip via a bonding wire by using a capillary. The second electric conductor pattern is at least formed entirely covering the pad portion.

Hence, according to yet another aspect of the present disclosure, by forming the electric conductor pattern entirely covering the pad portion, a degree of rigidity of the pad portion can be increased. With this, sinking of the bonding pad during wire bonding can be reduced or suppressed while enabling reduction or suppression of connection failure.

Yet another aspect of the present disclosure provides a novel method of producing a FPC substrate comprising the steps of: forming electric conductor layers on respective front and back surfaces of a base film; performing etching on the electric conductor layer disposed on the front surface of the base film by using a resist as a protection film, thereby forming a pattern in a desired shape as a first electric conductor pattern; and affixing a cover film having an adhesive layer on one side thereof to a front surface of the first electric conductor pattern other than a portion of the first electric conductor pattern, which ultimately becomes a bonding pad and a front surface of the base film exposed from the electric conductor pattern, thereby exposing the portion ultimately becoming the bonding pad.

The method further comprising the steps of: forming a metal plating layer as the bonding pad on a portion of the first electric conductor pattern exposed from the cover film by applying electrolytic plating; performing etching on the electric conductor layer disposed on the back surface of the base film by using a resist as a protection film, thereby forming a pattern in a desired shape at least entirely extended below the bonding pad as a second electric conductor pattern, and affixing a cover film having an adhesive layer on one side thereof to a back surface of the second electric conductor pattern and portions of the base film exposed from the electric conductor pattern.

The method further comprising the steps of: molding the FPC substrate into a desired outer shape by applying die cutting thereto; applying an adhesive layer to a back surface of the cover film, and gluing the cover film into a reinforcing plate.

Hence, according to another aspect of the present disclosure providing the method of producing the FPC substrate, sinking of the bonding pad during wire bonding can be reduced or suppressed while enabling reduction or suppression of connection failure.

BRIEF DESCRIPTION OF THE DRAWINGS

A more complete appreciation of the present disclosure and many of the attendant advantages of the present disclosure will be more readily obtained as substantially the same becomes better understood by reference to the following detailed description when considered in connection with the accompanying drawings, wherein.

DETAILED DESCRIPTION

Figure 1:
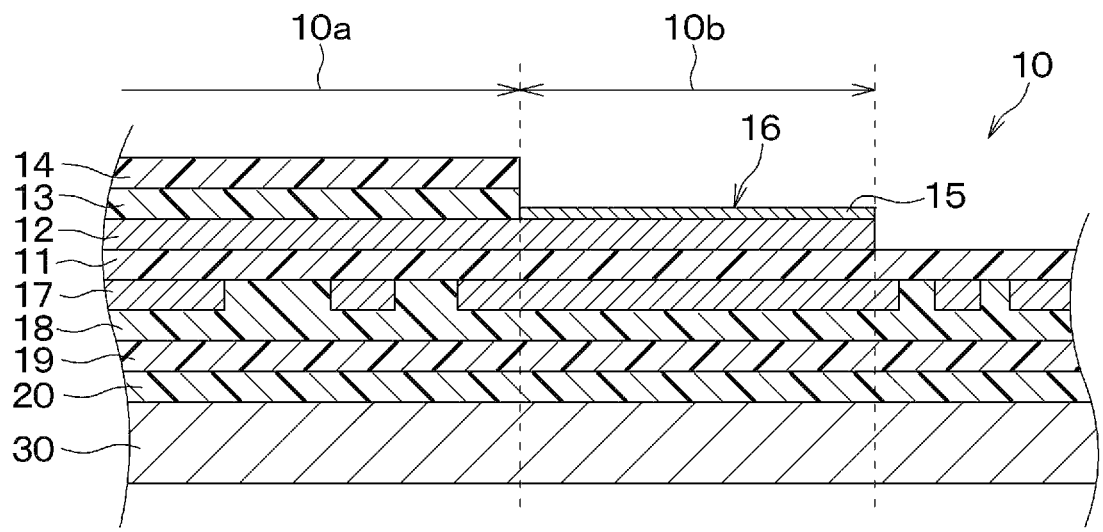
FIG. 1 is a cross-sectional view illustrating a FPC substrate according to a first embodiment of the present disclosure.

Referring now to the drawings, wherein like reference numerals designate identical or corresponding parts throughout the several views thereof, and portions identical or equivalent to each other are assigned with the same signs in each of the blow described embodiments.

A first embodiment will be initially described herein below with reference to FIG. 1. As shown, a FPC substrate 10 of this embodiment includes a base film 11, an electric conductor pattern 12, and an adhesive layer 13. The FPC substrate 10 also includes a cover film 14 and a metal plating layer 15.

The base film 11 is made of insulating material, such as polyimide, etc., and is used as a substrate to form the electric conductor pattern 12 or the like thereon. Further, the electric conductor pattern 12 is made of conductive material, such as a copper foil, etc., and is formed on a surface of the base film 11. Hence, the electric conductor pattern 12 acts as a first electric conductor pattern in this disclosure. Accordingly, on both front and back surfaces of the base film 11, respective circuits are formed by the electric conductor pattern 12 and the below described electric conductor pattern 17. That is, FIG. 1 is a cross-sectional view taken along a signal line formed by the electric conductor pattern 12.

Further, as shown, the adhesive layer 13 is formed to substantially cover the electric conductor pattern 12. The adhesive layer 13 is made of insulating material, such as epoxy resin, etc., and bonds the cover film 14 to the electric conductor pattern 12. Hence, the adhesive layer 13 acts as a first adhesive layer in this disclosure. The cover film 14 is made of insulating material, such as polyimide, etc., and protects the electric conductor pattern 12. Hence, the cover film 14 acts as a first cover film in this disclosure.

Further, as shown, a part of the electric conductor pattern 12 is exposed from both the adhesive layer 13 and the cover film 14. On a surface of the exposed portion of the electric conductor pattern 12, a metal plating layer 15 made of metal, such as Au (gold), etc., is formed to substantially cover the exposed portion. Hence, a bonding pad 16 is formed by the metal plating layer 15 and the electric conductor pattern 12 exposed from both the adhesive layer 13 and the cover film 14 to bring the FPC substrate 10 in connect with an IC chip or the like. Of the FPC substrate 10, a portion, in which a circuit is formed by both the electric conductor pattern 12 covered with the cover film 14 and an electric conductor pattern 17 described later is herein below referred to as a circuit portion 10a in the present disclosure. By contrast, of the FPC substrate 10, a portion, in which the bonding pad 16 is formed is herein below referred to as a pad portion 10b.

Further, the FPC substrate 10 also includes an adhesive layer 18 and a cover film 19 in addition to both the base film 11 and the electric conductor pattern 17 or the like. The electric conductor pattern 17 is made of conductive material, such as a copper foil, etc., and is formed on a back surface of the base film 11. Hence, the electric conductor pattern 17 acts as a second electric conductor pattern in this disclosure. The adhesive layer 18 is formed to substantially cover the electric conductor pattern 17. The adhesive layer 18 is made of insulating material, such as epoxy resin, etc., and is used to bond the cover film 19 to the electric conductor pattern 17. Hence, the adhesive layer 18 acts as a second adhesive layer in this disclosure. The cover film 19 is made of insulating material, such as polyimide, etc., and protects the electric conductor pattern 17. Hence, the cover film 19 acts as a second cover film in this disclosure.

Further, an adhesive layer 20 is formed on a surface of the cover film 19 opposite to a surface thereof facing the base film 11. The adhesive layer 20 is made of insulating material, such as an epoxy resin, etc. Hence, the adhesive layer 20 acts as a third adhesive layer in this disclosure. Further, the cover film 19 is bonded to a reinforcing plate 30 by the adhesive layer 20. The reinforcing plate 30 is made of metal, such as SUS (Steel Use Stainless), etc., and supports the FPC substrate 10 from a back side thereof during wire bonding.

In this way, by supporting the FPC substrate 10 with the reinforcing plate 30, connection failure can be reduced or suppressed. In addition, in this embodiment, more effectively to reduce or suppress connection failure, a degree of rigidity of the pad portion 10b is increased more than that of the circuit portion 10a.

Specifically, as shown, the circuit portion 10a has a mixture of a first portion, in which the electric conductor pattern 17 is formed to constitute a desired circuit, and a second portion, in which the electric conductor pattern 17 is not formed but the adhesive layer 18 adheres to the back surface of the base film 11. By contrast, as shown in the pad portion 10b, the electric conductor pattern 17 is formed entirely covering the pad portion 10b. That is, below the bonding pad 16 in the FPC substrate 10, the back surface of the base film 11 is entirely covered by the electric conductor pattern 17, and the electric conductor pattern 17 has a higher modulus of elasticity than the adhesive layer 18.

Next, a method of producing the FPC substrate 10 will be described herein below in detail with reference to applicable drawings. First, a base film 11 having electric conductor layers entirely lying on respective front and back surfaces thereof is prepared. Then, etching is performed on the electric conductor layer lying on the front surface of the base film 11 by using a resist as a protection film to form a pattern in a desired shape, thereby forming the electric conductor pattern 12. Then, a cover film 14 having an adhesive layer 13 on one side thereof is affixed to a front surface of the electric conductor pattern 12 and a front surface of the base film 11 exposed in a depth direction (not shown) in FIG. 1 from the electric conductor pattern 12. At this moment, a portion of the electric conductor pattern 12, which ultimately becomes the bonding pad 16 is exposed. Thereafter, a metal plating layer 15 is formed as a bonding pad 16 on a portion of the electric conductor pattern 12 exposed from the cover film 14 by applying electrolytic plating or the like thereto.

Further, etching is performed on the electric conductor layer lying on the back surface of the base film 11 by using a resist as a protection film to form a pattern in a desired shape, thereby forming the electric conductor pattern 17. Then, a cover film 19 having an adhesive layer 18 on one side thereof is affixed to a back surface of the electric conductor pattern 17 and portions of the base film 11 exposed from the electric conductor pattern 17. Thereafter, the FPC substrate 10 is molded into a desired outer shape by applying die cutting or the like thereto. Then, an adhesive layer 20 is applied to a back surface of the cover film 19 and the cover film 19 is glued to a reinforcing plate 30.

Figure 2:
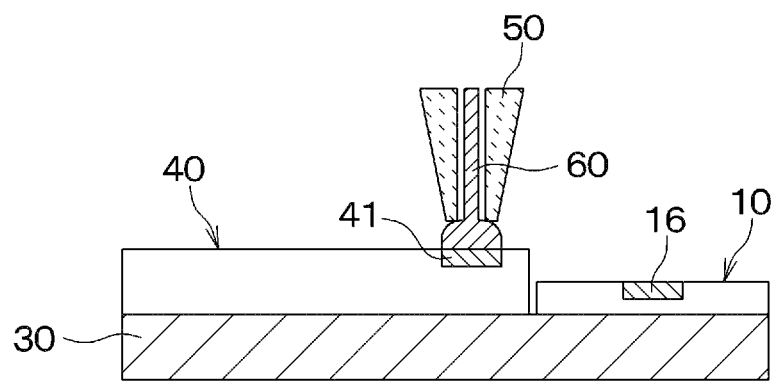
FIG. 2 is a cross-sectional view illustrating a process of bonding a wire to a semiconductor chip according to the first embodiment of the present disclosure.
Figure 3:
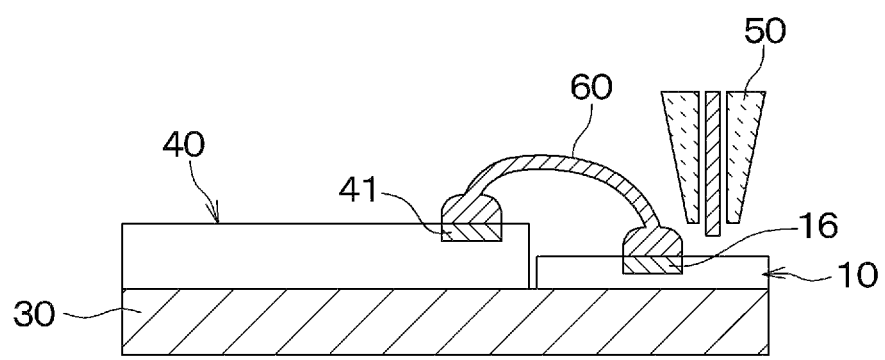
FIG. 3 is a cross-sectional view illustrating a process of bonding a wire to a FPC substrate according to the first embodiment of the present disclosure.

Then, the FPC substrate 10 bonded to the reinforcing plate 30 in this way is connected to an IC chip or the like by a bonding wire as illustrated in FIGS. 2 and 3. That is, FIGS. 2 and 3 illustrates a wire bonding step of connecting the FPC substrate 10 with the IC chip 40 bonded to the reinforcing plate 30.

Specifically, as shown in FIG. 2, in the wire bonding step, a capillary 50 brings an end of a bonding wire 60 passed through an inside thereof in contact with a bonding pad 41 on the IC chip 40 and applies a load to the bonding pad 41 to join the end of the bonding wire 60 and the bonding pad 41 together. The capillary 50 then moves to a position above another bonding pad 16 while forming a loop of the bonding wire 60 with one end thereof being joined to the bonding pad 41. Then, the capillary 50 brings the bonding wire 60 near an opening of the capillary 50 in contact with the other bonding pad 16 and applies a load to the other bonding pad 16 to join the bonding wire 60 near the opening and the other bonding pad 16 together. In this way, as shown in FIG. 3, the FPC substrate 10 is connected to the IC chip 40 by the bonding wire 60.

Figure 4:
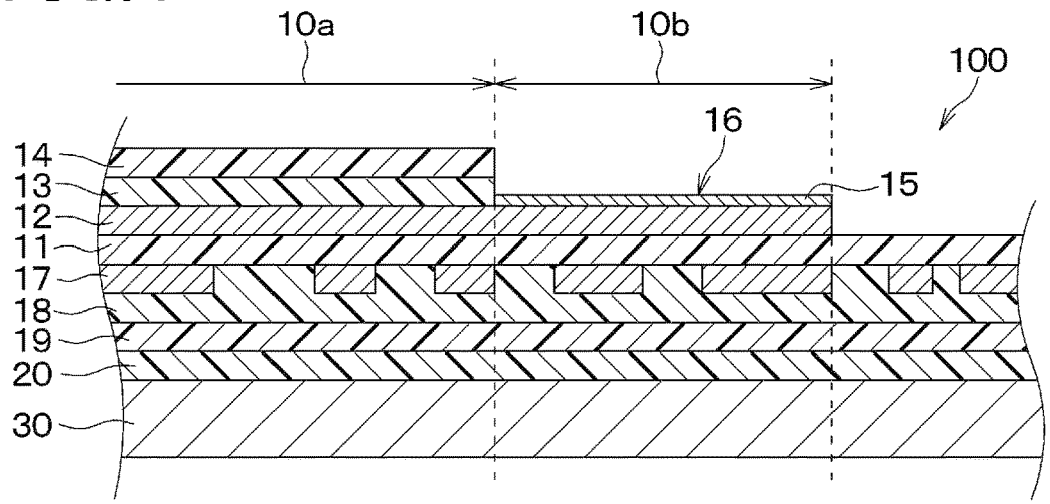
FIG. 4 is a cross-sectional view illustrating a comparative example according to the first embodiment of the present disclosure.

Next, a comparative example will be described with reference to FIG. 4. Unlike the FPC substrate 10 of this embodiment, a circuit is intermittently formed in the comparative example on a back surface of a base film 11 of a FPC substrate 100 even in a pad portion 10b. That is, below a bonding pad 16, a mixture of a first portion, in which an electric conductor pattern 17 is formed and a second portion, in which the electric conductor pattern 17 is not formed but an adhesive layer 18 adheres to a back surface of the base film 11 is present. Accordingly, a degree of rigidity of the pad portion 10b is equivalent to that of a circuit portion 10a in the comparative example.

However, in such a FPC substrate 100, when a bonding wire 60 is joined to a bonding pad 16, since rigidity of the pad portion 10b is low, the bonding pad 16 sinks inward and a load cannot be applied to the bonding pad 16 by the capillary 50, thereby causing connection failure therebetween.

By contrast, according to this embodiment, rigidity of the pad portion 10b is higher than rigidity of the circuit portion 10a. With this, sinking of the bonding pad 16 during wire bonding can be reduced or suppressed while maintaining flexibility of the circuit unit 10a, thereby enabling reduction or suppression of the connection failure therebetween.

Next, a second embodiment of the present disclosure will be herein below described in detail with reference to FIG. 5 and applicable drawings. Since this embodiment modifies the first embodiment only by differently increasing rigidity of the pad portion 10b from the first embodiment while substantially maintaining the rest of the FPC substrate, only different portions of the FPC substrate from the first embodiment will be herein below described.

Figure 5:
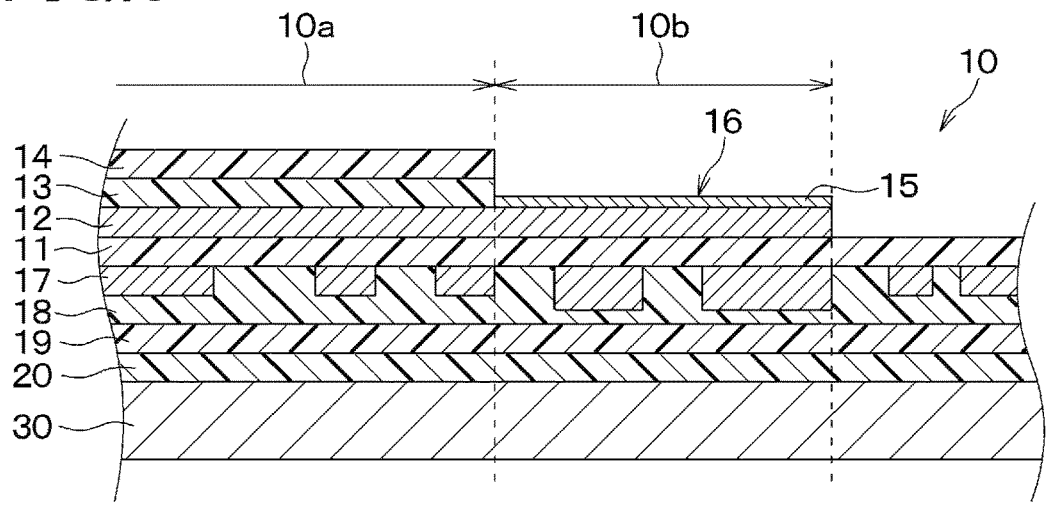
FIG. 5 is a cross-sectional view illustrating a FPC substrate according to a second embodiment of the present disclosure.

Specifically, as shown in FIG. 5, according to this embodiment, a circuit is also formed in the pad portion 10b on a back surface of the base film 11 in the same way as in a circuit portion 10a. However, an electric conductor pattern 17 located in the pad portion 10b is formed thicker than the electric conductor pattern 17 located in the circuit portion 10a to increase rigidity of the pad portion 10b more than that of the circuit portion 10a.

Such a FPC substrate 10 can be similarly produced as in the first embodiment as described below. That is, patterning is performed (on a base film 11) to obtain an electric conductor pattern 17. Then, conductive material is deposited on the electric conductor pattern 17 in a pad portion 10b to thicken the electric conductor pattern 17 of the pad portion 10b by using sputtering or the like. Here, various processes are similarly performed for a front surface of the base film 11 as performed in the first embodiment. Also, adhesion of the cover film 19, a die cutting process, and adhesion of a result of the die cutting process to the reinforcing plate 30 or the like may be similarly performed as in the first embodiment.

Thus, even in a situation in which a circuit formed by the electric conductor pattern 17 is present in the pad portion 10b, the rigidity of the pad portion 10b can be increased by thickly forming the electric conductor pattern 17 therein. Hence, substantially the same advantage can be obtained in this embodiment as obtained in the first embodiment. Here, although the electric conductor pattern 17 of the pad portion 10b is thickly formed in this embodiment, rigidity of the pad portion 10b can be also increased by forming an electric conductor pattern 12 located in the pad portion 10b to be thicker than an electric conductor pattern 12 located in the circuit portion 10a.

Next, a third embodiment of the present disclosure will be herein below described in detail with reference to FIG. 6 and applicable drawings. Since this embodiment modifies the first embodiment only by differently increasing rigidity of the pad portion 10b from the first embodiment while substantially maintaining the rest of the FPC substrate of the first embodiment, only different portions of the FPC substrate from the first embodiment will be herein below described.

Figure 6:
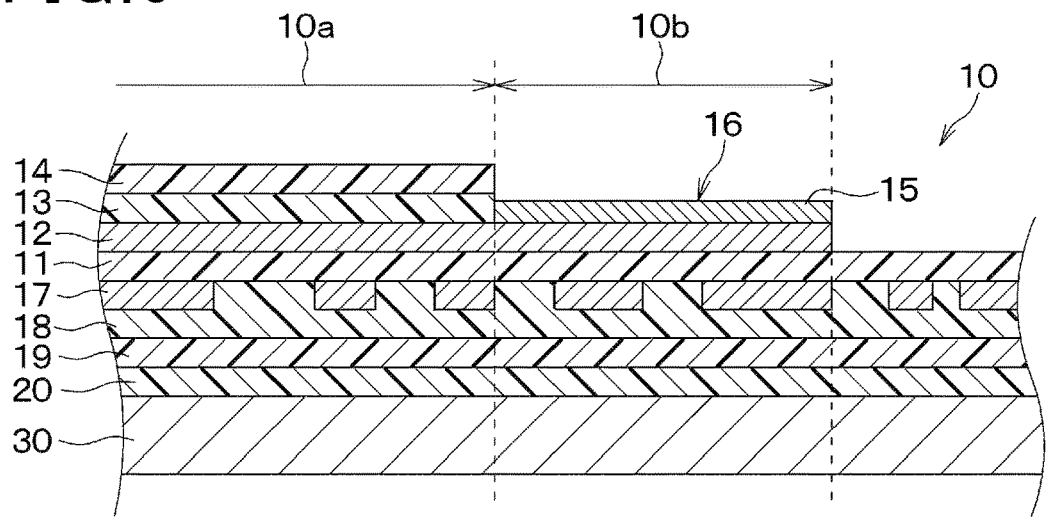
FIG. 6 is a cross-sectional view illustrating a FPC substrate according to a third embodiment of the present disclosure.

Specifically, as shown in FIG. 6, according to this embodiment, a circuit is also formed in a pad portion 10*b* on a back surface of a base film 11 in the same way as in a circuit portion 10*a*. Further, a metal plating layer 15 is formed thicker than that of the first embodiment to increase rigidity of the pad portion 10*b* higher than that of the circuit portion 10*a*. Specifically, in general, a thickness of the metal plating layer 15 is approximately 3 µm. In this embodiment, however, a thickness of the metal plating layer 15 is increased to either approximately 4 µm or more or approximately 5 µm or more to enhance rigidity of the pad portion 10*b* higher than rigidity of the circuit portion 10*a*.

In this way, even in a situation in which a circuit formed by the electric conductor pattern 17 is present in the pad portion 10*b*, rigidity of the pad portion 10*b* can be increased by thickly forming the metal plating layer 15. As a result, substantially the same advantage can be obtained in this embodiment as obtained in the first embodiment.

Next, a fourth embodiment of the present disclosure will be herein below described in detail with reference to FIG. 7 and applicable drawings. Since this embodiment modifies the first embodiment only by differently increasing rigidity of a pad portion 10*b* from the first embodiment while substantially maintaining the rest of the FPC substrate of the first embodiment, only different portions of the FPC substrate from the first embodiment will be described.

Figure 7:
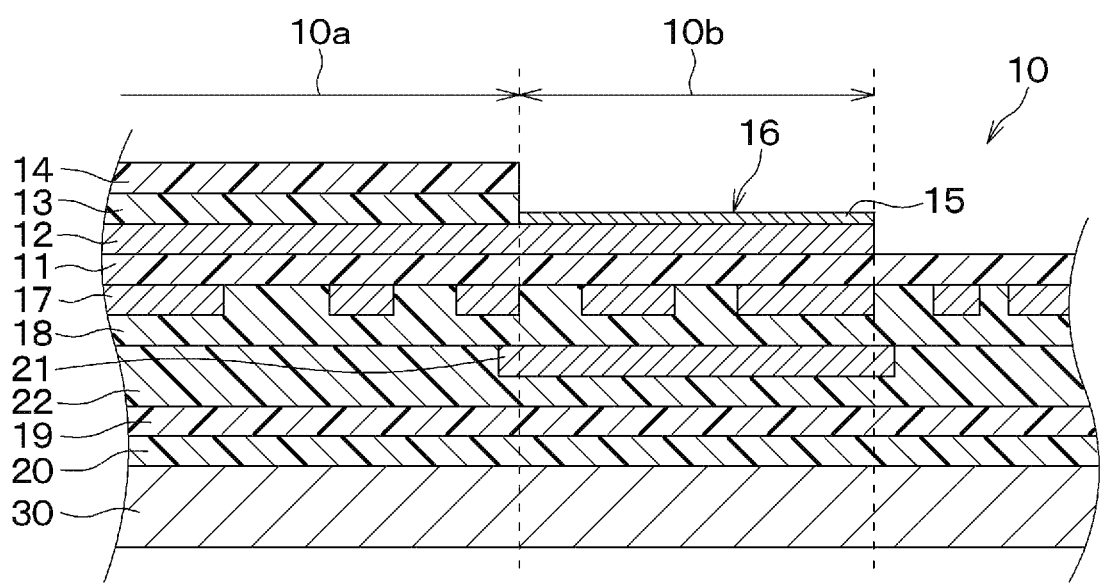
FIG. 7 is a cross-sectional view illustrating a FPC substrate according to a fourth embodiment of the present disclosure.

Specifically, as shown in FIG. 7, according to this embodiment, a circuit is again formed in a pad portion 10*b* on a back surface of a base film 11 in the same way as in a circuit portion 10*a*. Besides, a FPC substrate 10 of this embodiment includes a reinforcing layer 21 and an adhesive layer 22.

Specifically, the reinforcing layer 21 is formed in the pad portion 10*b* on an opposite surface of the adhesive layer 18 to a surface thereof facing the base film 11 to reinforce the pad portion 10*b* by increasing rigidity of the pad portion 10*b*. Such a reinforcing layer 21 may be made of metal, such as copper, etc., and is insulated from the electric conductor pattern 17 by the adhesive layer 18.

Further, the adhesive layer 22 is formed to substantially cover the reinforcing layer 21 and the adhesive layer 18 exposed from the reinforcing layer 21. Such an adhesive layer 22 is made of insulating material, such as epoxy resin, etc., to bond a cover film 19 to both the adhesive layer 18 and the reinforcing layer 21. Specifically, the cover film 19 is laminated on an opposite surface of the adhesive layer 22 to a surface thereof facing both the adhesive layer 18 and the reinforcing layer 21. Hence, according to this embodiment, since the reinforcing layer 21 is provided in the pad portion 10*b*, rigidity of the pad portion 10*b* is increased to be higher than the rigidity of the circuit portion 10*a*. Hence, the adhesive layer 22 acts as a second adhesive layer in this disclosure.

Such a FPC substrate 10 may be produced as described below. First, patterning is performed (on a base film 11) to obtain an electric conductor pattern 17. Then, an adhesive layer 18 is formed by coating to substantially cover both the electric conductor pattern 17 and a back surface of the base film 11 exposed from the electric conductor pattern 17. Then, a reinforcing layer 21 is formed on a surface of the adhesive layer 18 opposite to a surface thereof facing the base film 11 by using sputtering or the like. After that, a cover film 19 with an adhesive layer 22 on one side thereof is affixed to both the reinforcing layer 21 and the adhesive layer 18 exposed from the reinforcing layer 21. Here, various processes are similarly performed for a front surface of the base film 11 as in the first embodiment. Also, a die cutting process, and adhesion of a result of the die cutting process to the reinforcing plate 30 or the like may be performed in the same manner as in the first embodiment.

Thus, even if a circuit formed by the electric conductor pattern 17 is present in the pad portion 10*b*, rigidity of the pad portion 10*b* can be increased by the reinforcing layer 21. Accordingly, according to this embodiment, substantially the same advantage can be obtained as obtained in the first embodiment. Here, as noted from FIG. 7, the reinforcing layer 21 is entirely formed entirely covering the pad portion 10*b*. However, present disclosure is not limited thereto and the reinforcing layer 21 can be only partially formed in the pad portion 10*b*. Further, the reinforcing layer 21 can be formed on a front surface side of the base film 11.

Further, the present disclosure is not limited to the above-described first to fourth embodiments and includes various modifications of these embodiments as appropriate as long as each of these modifications falls within a scope of the claims listed below. Further, each of the above-described first to fourth embodiments can be appropriately combined as long as a combination is technically possible. In addition, elements constituting each of the above-described embodiments are not necessarily essential unless otherwise apparently mentioned as being particularly essential or considered to be apparently essential in principle.

Hence, various modifications of the present disclosure can be possible as will be herein below described with reference to applicable drawings. First, the present disclosure can be applied to a single-sided FPC substrate having an electric conductor pattern only on a front surface of the base film 11. Also, the present disclosure can be applied to a multilayer FPC substrate, in which three or more layers of electric conductor patterns are formed. For example, when the single-sided FPC substrate is employed in each of the second to fourth embodiments, rigidity of the pad portion 10*b* can be similarly increased. In such a situation, the FPC substrate 10 can be used without being attached to the reinforcing plate 30.

Secondly, in each of the second to fourth embodiments, the electric conductor pattern 17 can be formed entirely covering the pad portion 10*b* as in the first embodiment. Thirdly, in each the third and fourth embodiments, the respective electric conductor patterns 12 and 17 disposed in the pad portion 10*b* can be thicker than the electric conductor patterns 12 and 17 disposed in the circuit portion 10*a* as in the second embodiment. Fourthly, in the fourth embodiment, a thickness of the metal plating layer 15 can be 4 µm or more as in the third embodiment. Fifthly, three or four embodiments among the first to fourth embodiments can be optionally combined.

Sixthly, connection failure can be further reduced or suppressed by increasing the rigidity of the pad portion 10*b* in any one of the above-described first to fourth embodiments or an optional combination of any two or more of the first to fourth embodiments while adopting the blow described configuration.

For example, of the whole FPC substrate 10, at least one of the base film 11 and the adhesive layers 13, 18 and 20 is made of material such as an epoxy resin, etc., with an elastic modulus of approximately 1.5 GPa (giga pascal) or more. Further, of the whole FPC substrate 10, a thickness of at least any one of the base film 11 and the adhesive layers 13, 18 and 20 is 10 µm or less. That is, in general, a thickness of each of these layers 11, 13, 18 and 20 is usually more than from approximately 10 μm (micrometre) to approximately 20 μm (micrometre). Hence, according to this modification, since the at least one of these layers 11, 13, 18 and 20 is thinned to 10 μm or less, sinking of the capillary can be further effectively reduced or suppressed. This is because deformation of the FPC substrate 10 can be reduced due to reduction of a resin portion, (i.e., the base film 11 and the adhesive layers 13, 18 and 20) having a lower elastic modulus than the electric conductor patter 17 composed of a copper foil.

As another example, although rigidity of the pad portion 10b is higher than rigidity of the circuit portion 10a in each of the above-described first to fourth embodiments, the present disclosure is not limited thereto. That is, rigidity of the pad portion 10b can be substantially the same or lower than rigidity of the circuit portion 10a as long as connection failure can be reduced or suppressed. For example, when the electric conductor pattern 17 is formed across the entire pad portion 10b as in the first embodiment, sinking of the bonding pad 16 and accordingly connection failure can be reduced or suppressed even if rigidity of the pad portion 10b is lower than the rigidity of the circuit portion 10a.

Numerous additional modifications and variations of the present disclosure are possible in light of the above teachings. It is hence to be understood that within the scope of the appended claims, the present disclosure may be performed otherwise than as specifically described herein. For example, the present disclosure is not limited to the above-described printed circuit board and may be altered as appropriate. Further, the present disclosure is not limited to the above-described printed circuit board producing method and may be altered as appropriate.

What is claimed is:

1. A printed circuit board having at least a circuit portion and a pad portion separately located from the circuit portion, the printed circuit board comprising:
    a base film extended across the circuit portion and the pad portion, the base film being made of an insulating material;
    a first electric conductor pattern formed on a front surface of the base film, the first electric conductor pattern forming:
        a circuit in the circuit portion, and
        a bonding pad in the pad portion, the bonding pad being connected to an IC chip via a bonding wire by using a capillary;
    a first insulating cover film entirely covering the first electric conductor pattern except for the bonding pad,
    a second electric conductor pattern directly formed on a back surface of the base film; and
    a pad reinforcing layer disposed at least in the pad portion below the base film,
    wherein rigidity of the pad portion is higher than rigidity of the circuit portion, and
    wherein the pad reinforcing layer is made of metal insulated from the second electric conductor pattern.

2. The printed circuit board as claimed in claim 1, wherein the first electric conductor pattern is thicker in the pad portion than that in the circuit portion.

3. The printed circuit board as claimed in claim 1, further comprising a metal plating layer covering at least the bonding pad,
    wherein a thickness of the metal plating layer is approximately 4 μm or more.

4. The printed circuit board as claimed in claim 1, further comprising a first adhesive layer to cover the first electric conductor pattern and bond the first insulating cover film to the first electric conductor pattern,
    wherein at least one of the base film, the first insulating cover film, and the first adhesive layer located at least in the pad portion is made of material having an elastic modulus of approximately 1.5 GPa or more.

5. The printed circuit board as claimed in claim 1, further comprising an adhesive layer to cover the first electric conductor pattern and bond the first insulating cover film to the first electric conductor pattern,
    wherein a thickness of at least one of the base film, the first insulating cover film, and the adhesive layer located at least in the pad portion is approximately 10 μm or less.

6. The printed circuit board as claimed in claim 1, wherein the second electric conductor pattern is continuously formed over the pad portion.

7. The printed circuit board as claimed in claim 1, further comprising:
    at least one circuit formed by one of the first electric conductor pattern and the second electric conductor pattern; and
    a bonding pad composed of a part of the first electric conductor pattern exposed from the first insulating cover film,
    wherein the second electric conductor pattern is continuously formed entirely covering the pad portion.

8. The printed circuit board as claimed in claim 1, wherein one of the first electric conductor pattern and the second electric conductor pattern located in the pad portion is thicker than corresponding one of the first electric conductor pattern and the second electric conductor pattern located in the circuit portion.

9. The printed circuit board as claimed in claim 1, further comprising a reinforcing layer disposed in the pad portion below the bonding pad to reinforce the pad portion, the reinforcing layer being made of metal insulated from both the first electric conductor pattern and the second electric conductor pattern.

10. The printed circuit board as claimed in claim 1, further comprising:
    a first adhesive layer to cover the first electric conductor pattern and bond the first insulating cover film to the first electric conductor pattern;
    a second insulating cover film covering the second electric conductor pattern;
    a second adhesive layer to cover the second electric conductor pattern and bond the second insulating cover film to the second electric conductor pattern;
    a board reinforcing plate to reinforce the printed circuit board; and
    a third adhesive layer to bond the second insulating cover film to the board reinforcing plate,
    wherein at least any one of the base film, the first insulating cover film, the first adhesive layer, the second insulating cover film, the second adhesive layer, and the third adhesive layer is made of material with an elastic modulus of about 1.5 GPa or more.

11. The printed circuit board as claimed in claim 1, further comprising:
    a first adhesive layer to cover the first electric conductor pattern and bond the first insulating cover film to the first electric conductor pattern;
    a second insulating cover film to cover the second electric conductor pattern;

a second adhesive layer to cover the second electric conductor pattern and bond the second insulating cover film to the second electric conductor pattern;

a board reinforcing plate to reinforce the printed circuit board; and a third adhesive layer to bond the second insulating cover film to the board reinforcing plate, wherein a thickness of at least any one of the base film, the first insulating cover film, the first adhesive layer, the second insulating cover film, the second adhesive layer, and the third adhesive layer is less than 10 μm.

12. The printed circuit board as claimed in claim 1, wherein the pad reinforcing layer is disposed at least in the pad portion below the base film.

13. The printed circuit board as claimed in claim 1, wherein
the pad reinforcing layer is insulated from the first electric conductor pattern, the second electric conductor pattern and the bonding pad.

14. The printed circuit board as claimed in claim 1, wherein
the pad reinforcing layer is formed across the longitudinal direction of the pad portion.

* * * * *